United States Patent
Sung

(10) Patent No.: US 8,921,845 B2
(45) Date of Patent: Dec. 30, 2014

(54) OLED UNIT, METHOD FOR MAKING THE SAME, AND OLED ILLUMINATING DEVICE COMPRISING THE SAME

(71) Applicant: Ultimate Image Corporation, Miaoli (TW)

(72) Inventor: Chih-Feng Sung, Miaoli (TW)

(73) Assignee: Ultimate Image Corporation, Miaoli (TW)

( * ) Notice: Subject to any disclaimer, the term of this patent is extended or adjusted under 35 U.S.C. 154(b) by 0 days.

(21) Appl. No.: 13/945,164

(22) Filed: Jul. 18, 2013

(65) Prior Publication Data
US 2014/0027742 A1    Jan. 30, 2014

(30) Foreign Application Priority Data
Jul. 24, 2012   (TW) .............................. 101126616 A

(51) Int. Cl.
*H01L 35/24*       (2006.01)
*H01L 51/52*       (2006.01)

(52) U.S. Cl.
CPC ........ *H01L 51/5203* (2013.01); *H01L 51/5237* (2013.01); *H01L 51/524* (2013.01); *H01L 2251/5361* (2013.01)
USPC ...................................... 257/40; 257/E51.001

(58) Field of Classification Search
CPC ............ H01L 51/0545; H01L 51/0541; H01L 51/0036; H01L 51/5012; B82Y 10/00
USPC .............................................. 257/40, E51.001
See application file for complete search history.

(56) References Cited

U.S. PATENT DOCUMENTS

2002/0181853 A1* 12/2002 Ido et al. .......................... 385/19
2006/0227838 A1* 10/2006 Hata et al. ................ 372/50.124

* cited by examiner

*Primary Examiner* — Anthony Ho
(74) *Attorney, Agent, or Firm* — Trop Pruner & Hu, P.C.

(57) ABSTRACT

A method for producing an organic light emitting diode (OLED) unit includes: (a) forming an electrode pad on a substrate; (b) forming an insulating layer to cover and to partially expose the electrode pad; (c) forming an electrically conductive oxide layer on the insulating layer in such a manner that the exposed electrode pad is covered by and electrically coupled to the electrically conductive oxide layer; and (d) forming an organic illuminating multilayer structure on the substrate, the organic illuminating multilayer structure including an inner electrode that is electrically coupled to the electrode pad.

10 Claims, 6 Drawing Sheets

OLED UNIT, METHOD FOR MAKING THE SAME, AND OLED ILLUMINATING DEVICE COMPRISING THE SAME

CROSS-REFERENCE TO RELATED APPLICATION

This application claims priority of Taiwanese Patent Application No. 101126616, filed on Jul. 24, 2012.

BACKGROUND OF THE INVENTION

1. Field of the Invention

The invention relates to an illuminating device, more particularly to an organic light emitting diode illuminating device.

2. Description of the Related Art

Referring to FIG. 1, Taiwanese Patent No. I307559 discloses a conventional organic light emitting diode (abbreviated as OLED hereinafter) illuminating device 1, which includes a substrate 11, a bottom electrode layer 12, an organic light emitting structure 13 disposed on the bottom electrode layer 12, a top electrode layer 14 disposed on the organic light emitting structure 13, and a packaging cover 15.

The bottom electrode layer 12 is formed on a top surface of the substrate 11 and has an inner electrode zone 122 and an outer electrode zone 121 that is electrically coupled to the inner electrode zone 121 and that is exposed from the organic light emitting structure 13. The top electrode layer 14 has an inner electrode zone 142 that covers the organic light emitting structure 13, and an outer electrode zone 141 that is electrically coupled to the inner electrode zone 142 of the top electrode layer 14, that is formed on the top surface of the substrate 11, and that is spaced apart from the bottom electrode layer 12. The packaging cover 15 partially covers the outer electrode zones 121, 141 of the top and bottom electrode layers 12, 14.

People who have ordinary skill in the art would appreciate that the top and bottom electrode layers 12, 14 are usually made of a metallic material having high electrical conductivity. Although the packaging cover 15 of the conventional OLED illuminating device 1 can prevent the inner electrode zones 122, 142 of the top and bottom electrode layers 12, 14 from being exposed to the exterior environment, the outer electrode zones 121, 141 of the top and bottom electrode layers 12, 14, which are partially exposed to the exterior environment, are highly susceptible to damage caused by reaction with atmospheric components such as oxygen and water, thereby adversely affecting electrical property thereof. Moreover, when a functional testing is performed, a probe which is in contact with the outer electrode zones 121, 141 of the top and bottom electrode layers 12, 14 may cause damage thereto and adversely affect the electrical property thereof.

U.S. Pat. No. 7,026,660 B2 discloses a conventional OLED device provided with a polyimide layer to encapsulate contact conductors, but bond pads thereof are exposed to the exterior environment and may still suffer from damage caused by detrimental reaction with atmospheric constituents such as oxygen and water.

Therefore, there is a need in the art to improve the structure of the OLED illuminating device so as to prolong the service life of the OLED illuminating device.

SUMMARY OF THE INVENTION

Therefore, the object of the present invention is to provide a method for producing an OLED unit, an OLED unit and an OLED illuminating device that can alleviate the aforementioned drawback of the prior art.

According to one aspect of the present invention, a method for producing an OLED unit includes the steps of:

(a) forming an electrode pad on a substrate;

(b) forming an insulating layer to cover and to partially expose the electrode pad;

(c) forming an electrically conductive oxide layer on the insulating layer in such a manner that the exposed electrode pad is covered by and electrically coupled to the electrically conductive oxide layer; and (d) forming an organic illuminating multilayer structure on the substrate, the organic illuminating multilayer structure including an inner electrode that is electrically coupled to the electrode pad.

According to another aspect of the present invention, an OLED unit includes:

a substrate having a top surface;

an organic illuminating multilayer structure formed on the top surface of the substrate and including at least one inner electrode layer;

at least one outer electrode including:
an electrode pad that is formed on the substrate and that is electrically coupled to the inner electrode layer,
an insulating layer that covers and partially exposes the electrode pad, and
an electrically conductive oxide layer that covers and is electrically coupled to the exposed electrode pad; and
a packaging cover that covers the organic illuminating multilayer structure.

According to yet another aspect of the present invention, an OLED illuminating device is adapted to be electrically coupled to an external power supply and includes:

an OLED unit; and a connector including a housing member and at least one electrically conductive connecting member, the housing member having a surrounding wall that defines a receiving space therein for receiving the OLED unit, the electrically conductive connecting member being disposed in the surrounding wall and having one end that is disposed in the receiving space and that is electrically coupled to an outer electrode of the OLED unit, and the other end that is adapted to be electrically coupled to the external power supply.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
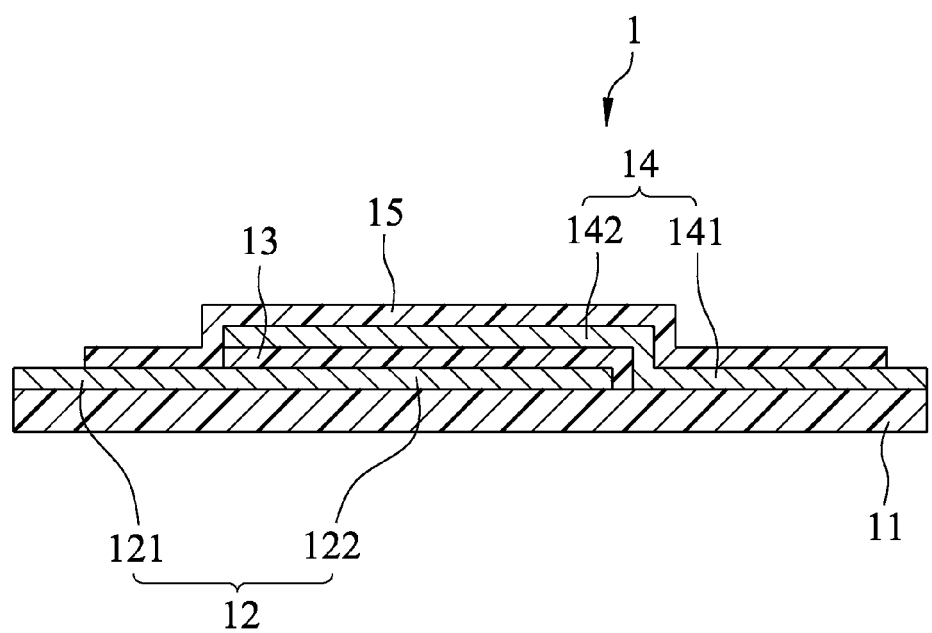
FIG. 1 is a sectional view of a conventional OLED light emitting unit disclosed in Taiwanese Patent No. I307559.

Before the present invention is described in greater detail, it should be noted that like elements are denoted by the same reference numerals throughout the disclosure.

Figure 2:
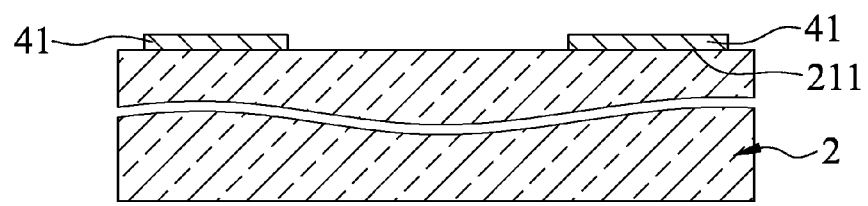
FIG. 2 is a fragmentary sectional view illustrating step (a) of the preferred embodiment of a method for producing an OLED unit according to the present invention, in which two electrode pads are formed on a substrate.

Referring to FIGS. 2 to 7, the preferred embodiment of a method for producing an OLED unit 6 according to the present invention includes the following steps:

Step (a): forming two electrode pads 41 on a surrounding portion 211 of a top surface 21 of a substrate 2 (see FIG. 2). The electrode pads 41 are spaced apart from each other. Preferably, each of the electrode pads 41 has a top surface area ranging from 20 mm$^2$ to 100 mm$^2$. It should be noted that, while two electrode pads 41 are exemplified herein, the number of the electrode pads 41 should not be limited to the disclosure in this preferred embodiment.

Figure 3:
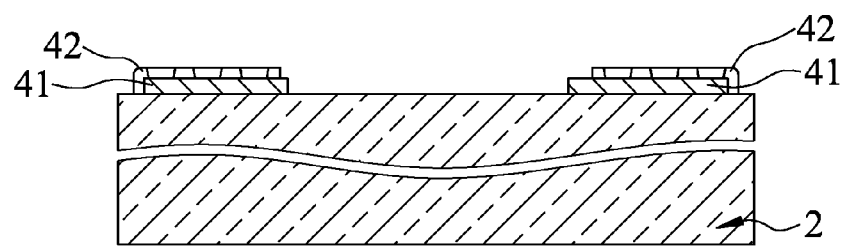
FIG. 3 is a fragmentary sectional view illustrating step (b) of the preferred embodiment of the method, in which insulating layers are formed.
Figure 7:
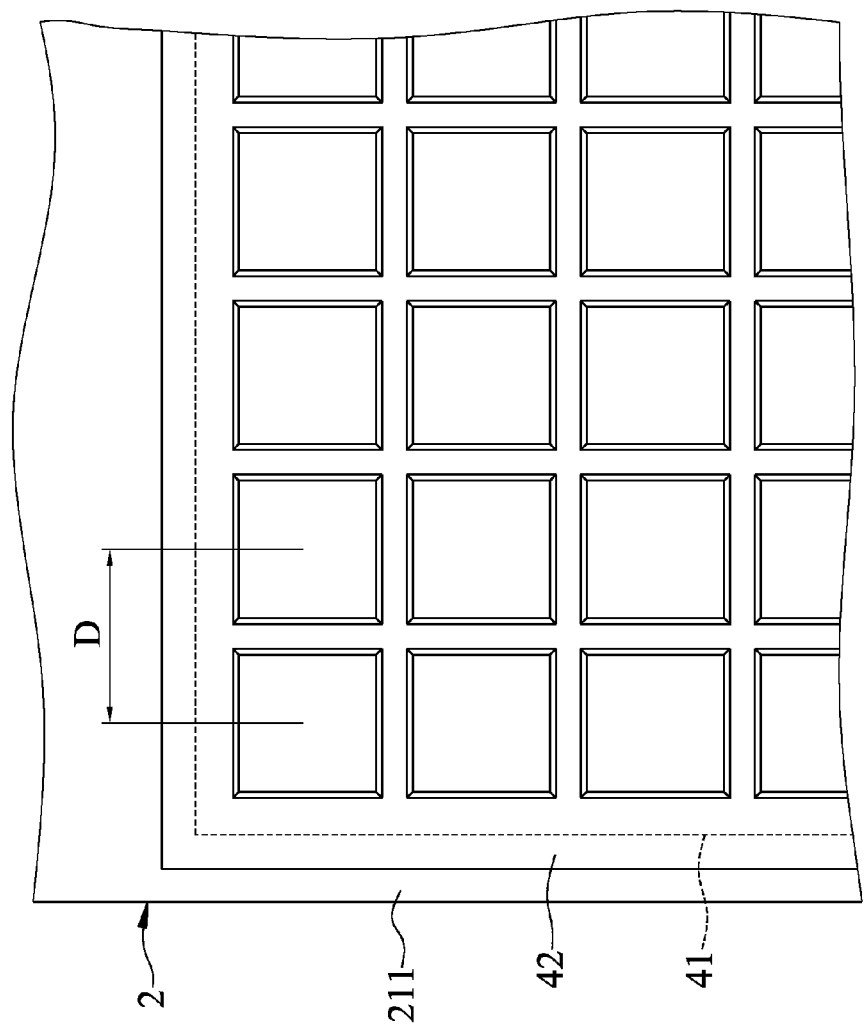
FIG. 7 is a fragmentary top view illustrating the insulating layer and the electrode pad.

Step (b): forming two insulating layers 42 to respectively cover and to partially expose the electrode pads 41 (See FIGS. 3 and 7). In this preferred embodiment, the insulating layers 42 are made of insulating materials, such as SiOx, SiNx and so forth. Since the electrode pads 41 are usually made of a metallic material that is different from the insulating layer 42, interfacial stress usually occurs at interfaces between the electrode pads 41 and the respective insulating layers 42. Thus, the insulating layers 42 are preferably formed by chemical vapor deposition to improve adhesion strength between the electrode pads 41 and the respective insulating layers 42. In this embodiment, the insulating layers 42 define a plurality of holes that expose respectively the electrode pads 41 (see FIG. 7). Preferably, the holes of the insulating layers 42 are defined in a grid pattern, and a center-to-center distance (D) between two adjacent ones of the holes ranges from 50 μm to 500 μm. Accordingly, an area of the electrode pads 41 exposed by each of the holes of the insulating layers 42 ranges from 30 μm×30 μm to 300 μm×300 μm. More preferably, the center-to-center distance (D) ranges from 200 μm to 300 μm, and the exposed area of the electrode pads 41 exposed by each of the holes of the insulating layers 42 ranges from 100 μm×100 μm to 200 μm×200 μm. Preferably, the holes of the insulating layers 42 are formed by photolithography techniques. Preferably, each of the insulating layers 42 has a thickness ranging from 250 nm to 500 nm.

Figure 4:
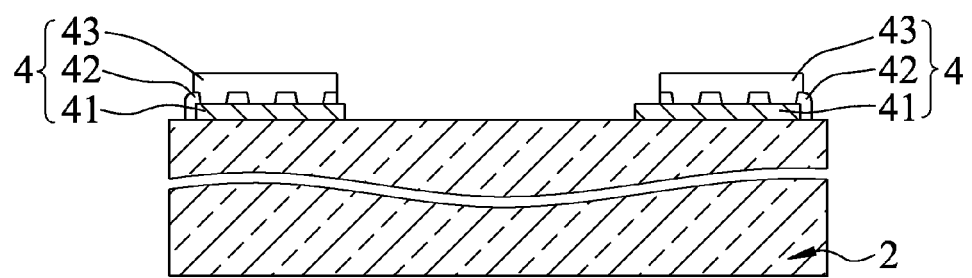
FIG. 4 is a fragmentary sectional view illustrating step (c) of the preferred embodiment of the method, in which electrically conductive oxide layers are formed.

Step (c): forming two electrically conductive oxide layers 43 respectively on the insulating layers 42 in such a manner that the exposed electrode pads 41 are respectively covered by and electrically coupled to the electrically conductive oxide layers 43 (see FIG. 4). The electrode pads 41, the insulating layers 42, and the electrically conductive oxide layers 43 form two spaced-apart outer electrodes 4. In this embodiment, the electrically conductive oxide layer 43 is one of indium tin oxide and indium zinc oxide. Preferably, the electrically conductive oxide layer 43 has a thickness ranging from 40 nm to 100 nm.

Figure 5:
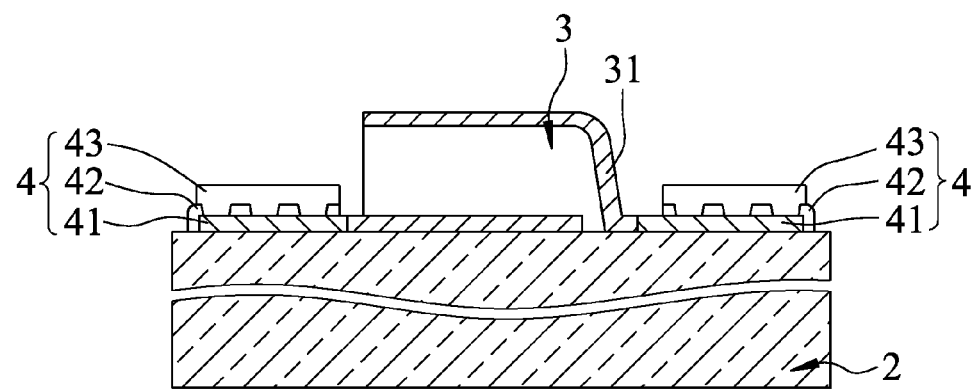
FIG. 5 is a fragmentary sectional view illustrating step (d) of the preferred embodiment, in which an organic illuminating multilayer structure is formed on the substrate.

Step (d): forming an organic illuminating multilayer structure 3 on the top surface 21 of the substrate 2 (see FIG. 5). The organic illuminating multilayer structure 3 includes a bottom inner electrode 31 (e.g., an ITO anode layer), a hole injection layer, a hole transfer layer, an emissive layer, an electron transfer layer, an electron injection layer, and a top inner electrode 31 that are sequentially stacked on the top surface 21 of the substrate 2. The top and bottom inner electrodes 31 are respectively and electrically coupled to the electrode pads 41.

Figure 6:
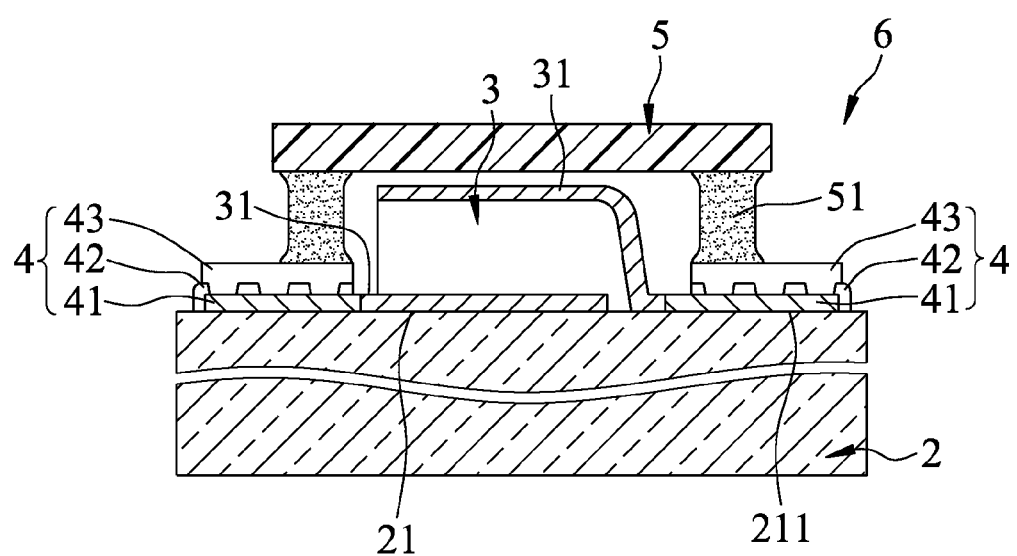
FIG. 6 is a fragmentary sectional view illustrating step (e) of the preferred embodiment of the method, in which a packaging cover covers the organic illuminating multilayer structure so as to obtain an OLED unit.

Step (e): packaging the organic illuminating multilayer structure 3 by a packaging cover 5 via a packaging glue 51, so as to obtain the OLED unit 6 (see FIG. 6). The packaging glue 51 is usually formed on a bottom surface of the packaging cover 5 and is disposed between the electrode pads 41 and the organic illuminating multilayer structure 3 on the top surface 21 of the substrate 2.

In this embodiment, the bottom inner electrode 31 and the electrode pads 41 are first formed on the top surface 21 of the substrate 2, followed by sequentially forming the insulating layers 42 and the electrically conductive oxide layer 43 on the electrode pads 41. Thereafter, the hole injection layer, the hole transfer layer, the emissive layer, the electron transfer layer, the electron injection layer, and the top inner electrode 31 are sequentially formed on the bottom inner electrode 31 by evaporation method. However, the organic illuminating multilayer structure 3 may be formed prior to or after the formation of the insulating layers 42 and the electrically conductive oxide layer 43.

It should be noted that, each of the holes of the insulating layers 42 is defined by a surrounding surface. An angle between the surrounding surface and a top surface of each of the electrode pads 41 is not greater than 75° (and preferably ranges from 45° to 75°), so as to let the electrically conductive oxide layers 43 fully cover the respective insulating layers 42 and be electrically coupled to the electrode pads 41.

It is also worth noting that, in this embodiment, by controlling the center-to-center distance (D) between two adjacent ones of the holes, the exposed area of the electrode pads 41 exposed by each of the holes of the insulating layers 42 is large enough to provide electrical coupling between the electrically conductive oxide layers 43 and the respective electrode pads 41. Also, since the top surface area of each of the electrode pads 41 preferably ranges from 20 mm$^2$ to 100 mm$^2$, which is substantially large, it only requires a simple manufacturing process to produce, thereby improving the product yield of the OLED unit 6.

As shown in FIG. 6, the OLED unit 6 produced by the method of the present invention includes the substrate 2, the organic illuminating multilayer structure 3, the packaging cover 5, and two outer electrodes 4 each of which includes the electrode pad 41, the insulating layer 42, and the electrically conductive oxide layer 43.

Figure 8:
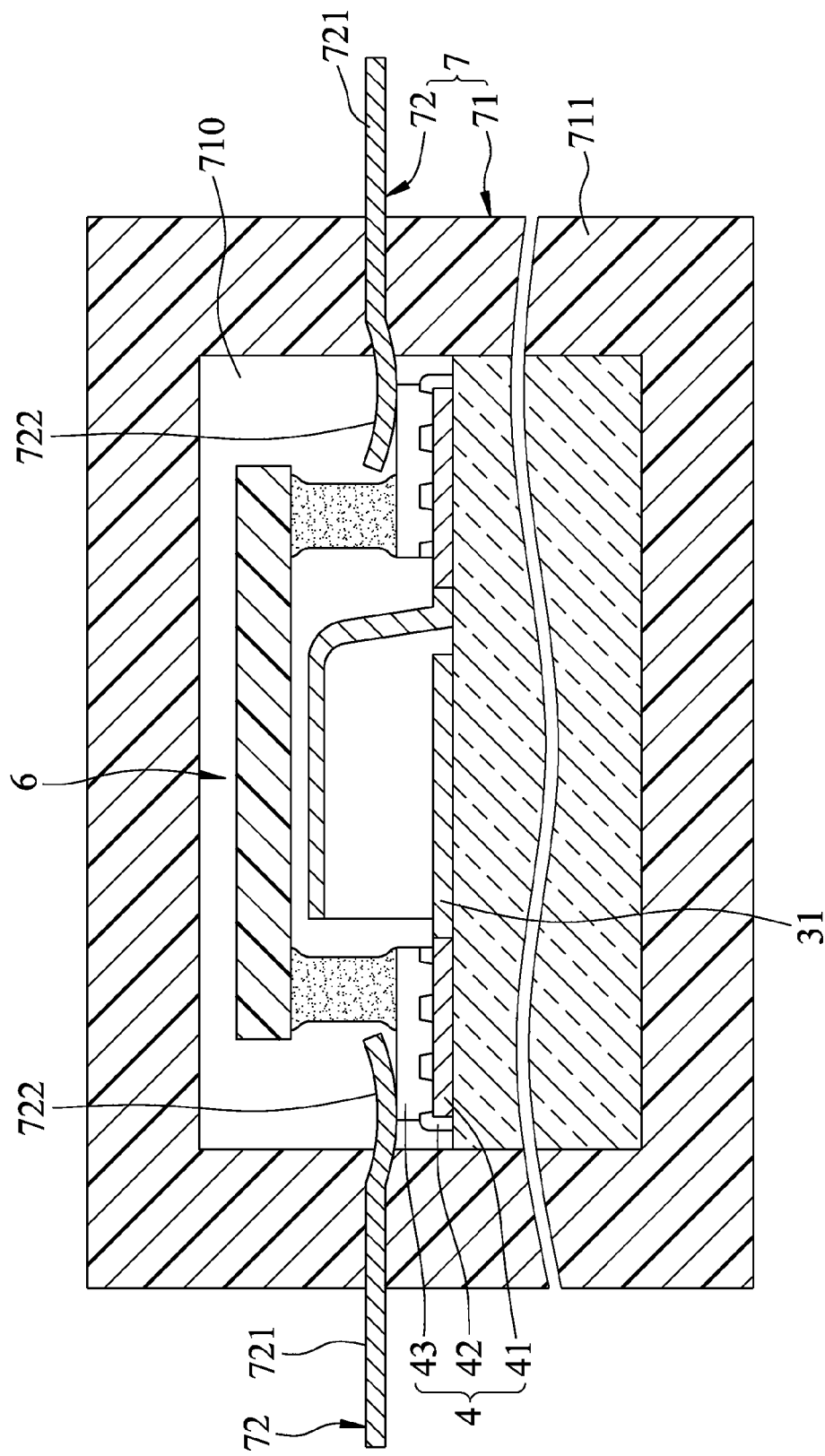
FIG. 8 is a fragmentary sectional view of the preferred embodiment of an OLED illuminating device according to the present invention.

Referring to FIG. 8, the preferred embodiment of an OLED illuminating device according to the present invention is adapted to be electrically coupled to an external power supply (not shown in Figure), and includes the OLED unit 6 (shown in FIG. 6) and a connector 7. The connector 7 includes a housing member 71 and a pair of electrically conductive connecting members 72. The housing member 71 has a surrounding wall 711 which defines a receiving space 710 therein for receiving the OLED unit 6. Each of the electrically conductive connecting members 72 is disposed in the surrounding wall 711 and has one end 722 that is disposed in the receiving space 710 and that is electrically coupled to the OLED unit 6, and the other end 721 that is adapted to be electrically coupled to the external power supply for transmitting power to the OLED unit 6. Specifically, the electrically conductive connecting members 72 are spaced apart from each other and are respectively and electrically coupled to the outer electrodes 4 of the OLED unit 6.

The electrically conductive oxide layers 43 of the outer electrodes 4 of the OLED unit 6 prevent the electrode pads 41 from damage caused by exposure to atmospheric constituents, such as oxygen and water. Moreover, the insulating layers 42 of the outer electrodes 4 can provide protection to the electrode pads 41 against damage caused by a probe during a functional testing, since the probe may only cause damage to part of the electrical conductive oxide layers 43 that are disposed on the insulating layers 42. Meanwhile, the electrical connection between the electrode pads 41 and the respective electrically conductive oxide layers 43 still remains by the physical contact therebetween in the holes of the insulating layers 42.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An OLED unit comprising:
    a substrate having a top surface;
    an organic illuminating multilayer structure formed on the top surface of said substrate and including at least one inner electrode layer;
    at least one outer electrode including:
        an electrode pad that is formed on said substrate and that is electrically coupled to said inner electrode layer,
        an insulating layer that covers and partially exposes said electrode pad, and
        an electrically conductive oxide layer that covers and is electrically coupled to said exposed electrode pad; and
    a packaging cover that covers said organic illuminating multilayer structure.

2. The OLED unit as claimed in claim 1, wherein said electrode pad of said outer electrode has a top surface area ranging from 20 mm$^2$ to 100 mm$^2$.

3. The OLED unit as claimed in claim 1, wherein said organic illuminating multilayer structure includes top and bottom inner electrode layers, said OLED unit comprising two outer electrodes that are spaced apart from each other and that are electrically and correspondingly coupled to said top and bottom inner electrode layers.

4. The OLED unit as claimed in claim 1, wherein said insulating layer is formed by a chemical vapor deposition method and defines a plurality of holes that expose said electrode pad.

5. The OLED unit as claimed in claim 4, wherein said holes of said insulating layer are defined in a grid manner, and a center-to-center distance between two adjacent ones of said holes ranges from 50 μm to 500 μm.

6. The OLED unit as claimed in claim 5, wherein the distance between two adjacent ones of said holes ranges from 200 μm to 300 μm.

7. The OLED unit as claimed in claim 1, wherein said insulating layer has a thickness ranging from 250 nm to 500 nm.

8. The OLED unit as claimed in claim 1, wherein said electrically conductive oxide layer has a thickness ranging from 40 nm to 100 nm.

9. An OLED illuminating device adapted to be electrically coupled to an external power supply, said OLED illuminating device comprising:
    said OLED unit as claimed in claim 1; and
    a connector including a housing member and at least one electrically conductive connecting member, said housing member having a surrounding wall that defines a receiving space therein for receiving said OLED unit, said electrically conductive connecting member being disposed in said surrounding wall and having one end that is disposed in the receiving space and that is electrically coupled to said outer electrode of said OLED unit, and the other end that is adapted to be electrically coupled to the external power supply.

10. The OLED illuminating device as claimed in claim 9, wherein said organic illuminating multilayer structure includes top and bottom inner electrode layers, said OLED unit comprising two outer electrodes that are spaced apart from each other and that are electrically and correspondingly coupled to said top and bottom inner electrode layers, said connector including two electrically conductive connecting members that are spaced apart from each other and that are electrically and respectively coupled to said outer electrodes of said OLED unit.

* * * * *